HEAT SINK FOR SEMI-CONDUCTOR ELEMENTS

Filed April 5, 1967

INVENTOR

Otto Scharli

By Pierce Scheffler & Parker
Attorneys 3,366,171
Patented Jan. 30, 1968

3,366,171

HEAT SINK FOR SEMI-CONDUCTOR ELEMENTS

Otto Schärli, Baden, Switzerland, assignor to Aktiengesellschaft Brown, Boveri & Cie, Baden, Switzerland, a joint-stock company Filed Apr. 5, 1967, Ser. No. 628,675
Claims priority, application Switzerland, July 14, 1966, 10,251/66
6 Claims. (Cl. 165—80)

ABSTRACT OF THE DISCLOSURE

A heat sink for receiving and cooling a plurality of semi-conductor elements comprises a generally cylindrical finned body made from a good heat conductive material such as copper or aluminum. A hollow space of truncated pyramidal form is provided within the body to receive the semi-conductor elements and a plane heat dissipating surface of each semi-conductor element is brought to bear against a corresponding plane face of the holow space by means of a wedging member which is moved axially and in the direction of the narrower end of the hollow space. The wedging member acts indirectly upon each semi-conductor element through an intermediate pressure transmitting plate.

The present invention relates to heat sinks for use with semi-conductor elements to cool them during operation.

It is known to provide heat sinks for such elements wherein the elements are screwed or pressed or otherwise fastened singularly into the heat sink structure.

The present invention provides a heat sink for receiving and cooling a plurality of semi-conductor elements having plane heat dissipating surfaces, which heat sink comprises a body of generally cylindrical external form containing a hollow space of truncated pyramidal form with a plurality of plane faces for receiving the said plane heat-dissipating surfaces, the said space being coaxial with the cylindrical body, and a wedging member which is movable in the axial direction of the said space and is arranged and adapted to press the semi-conductor elements against the plane faces of the heat sink.

This heat sink is suitable especially for semi-conductor elements with which are associated pressure-contact discs which at the same time serve as terminals, which discs have on one side a flat contact surface to press against a flat surface of the semi-conductor element and on the opposite side a convex surface which receives pressure from the wedging member.

Figure 1:
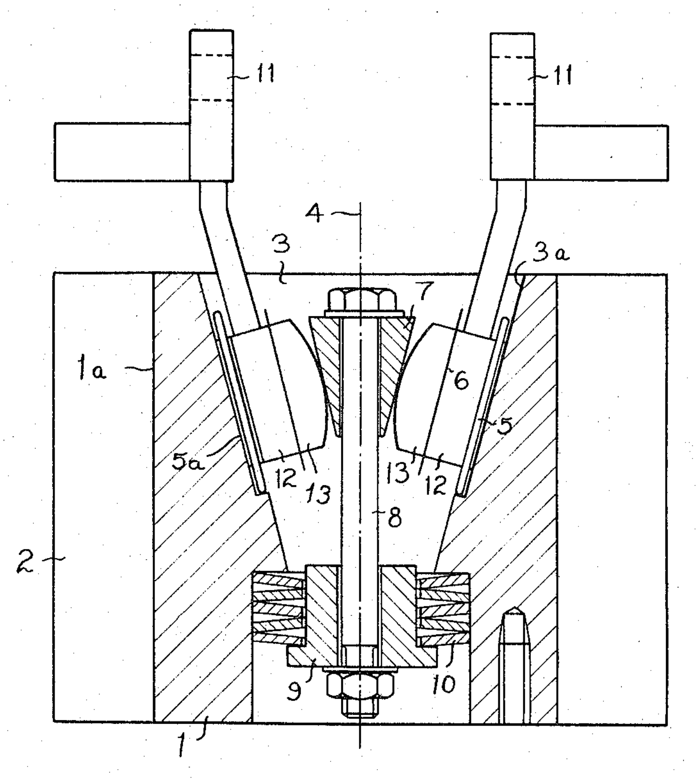
Figure 2:
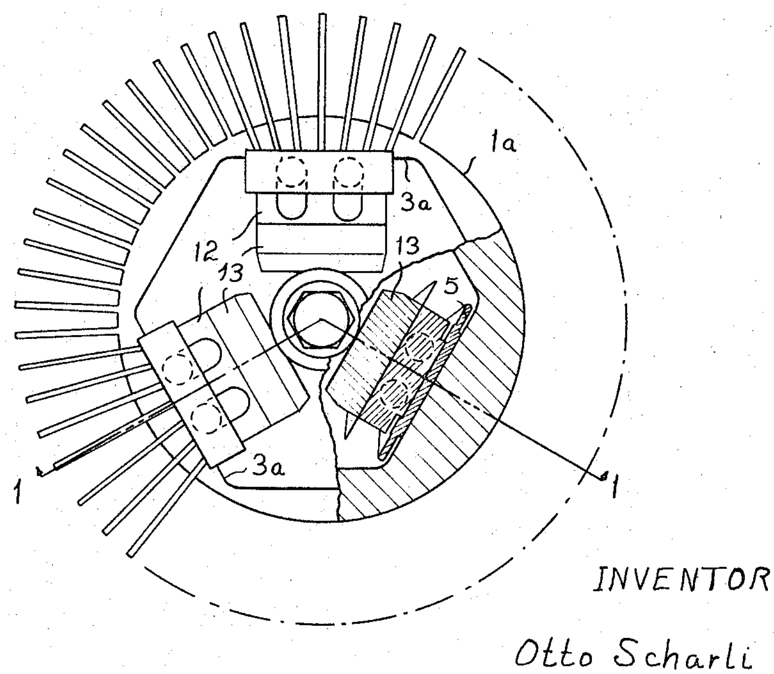

The invention will be further described with reference to the acompanying drawing in which:

FIGURE 1 is a vertical section on line 1—1 of FIGURE 2 through a heat sink embodying the invention with semi-conductor elements therein; and FIGURE 2 is a top plan view and showing one semi-conductor element in cross-section.

The drawings show a heat sink comprising a solid body 1, conveniently consisting of copper or aluminum, with an outer surface 1*a* of substantially cylindrical form on which are present cooling fins 2 of a known form. The body is hollow, containing a space 3 whose essential form is a truncated pyramid with six plane faces 3*a*. The space 3 is coaxial with the cylinder axis 4 of the body. In this hollow space three semi-conductor elements 5, e.g., rectifiers are accommodated. In surface contact with the semi-conductor elements are flat contact plates 12, on which press, through interposed insulating plates 6, pressure plates 13. The semi-conductor elements 5 are thereby pressed against corresponding flat surfaces 3*a* of the body. The necessary pressure is provided by a wedging body 7 which is displaceable in the axial direction and which engages convexly curved surfaces 13*a* of the pressure plates 13. A draw-bolt 8 carries the body 7 and is seated in a metal shouldered sleeve 9 which bears by way of a stack of spring washers 10 against an internal shoulder in the body. Thus, by tightening of bolt 8, the wedge body 7 can be drawn axially into and towards the narrower end of the truncated space 3 so as to clamp the plates 13 and 12 and the three semi-conductor elements 5 against the plane internal surfaces 3*a* of the body. Body 7 can be frusto-conical as shown or may have a truncated pyramidal form with faces corresponding to those of the space 3, i.e., it could have three faces in the case of the illustrated arrangement with three semi-conductor elements 5. Each semi-conductor element has terminals 11 for current supply. The truncated pyramidal surfaces 5*a* of the cooling body 1 form the common terminal.

The advantage of the arrangement consists in the fact that the total volume can be kept small. Instead of the cooling fins 2 for air cooling, the body can have pipelines soldered on for water-cooling.

I claim:

1. In a heat sink for receiving and cooling a plurality of semi-conductor elements having plane heat dissipating surfaces, the combination comprising a body made from a material having a good heat conductivity characteristic, said body being of generally cylindrical external surface form and containing therein a hollow space coaxial with said cylindrical surface, said space having a portion of truncated pyramidal form defined by a plurality of plane faces for receiving respectively plane heat dissipating surfaces of semi-conductor elements, and a wedging means mounted on said body and movable in an axial direction within said hollow space and operable to press plane heat dissipating surfaces of semi-conductor elements against said plane faces of said hollow space.

2. A heat sink as defined in claim 1 and which further includes a pressure plate for and interposed between each semi-conductor element and said wedging members for transmitting the pressure from said wedging member to each semi-conductor element.

3. A heat sink as defined in claim 2 wherein each said pressure plate includes a plane surface at one side transmitting pressure to each semi-conductor element and a convex surface at the opposite side in pressure receiving contact with the surface of said wedging member.

4. A heat sink as defined in claim 1 and which further includes a draw bolt for moving said wedging member axially in the direction of the narrower end of said truncated hollow space.

5. A heat sink as defined in claim 1 and which further includes a draw bolt passing through said wedging member at the head end of the bolt, the opposite threaded end of said bolt being passed through a flanged sleeve, and a spring interposed between said flange on said sleeve and an internal shoulder in said body at the narrower end of said truncated hollow space whereby a tightening of the nut on the threaded end of said bolt against said sleeve will serve to draw the bolt head and wedging member in the direction of the narrower end of said truncated hollow space.

6. A heat sink as defined in claim 5 and which further includes a pressure plate for and interposed between each semi-conductor element and said wedging member for transmitting the pressure from said wedging member to each semi-conductor element, each said pressure plate including a plane surface at one side transmitting pressure to each semi-conductor element and a convex surface at the opposite side in pressure receiving contact with the surface of said wedging member.

References Cited

UNITED STATES PATENTS

| | | | |
|---|---|---|---|
| 2,752,541 | 6/1956 | Losco | 317—234 |
| 2,879,977 | 3/1959 | Trought | 165—80 |
| 3,226,466 | 12/1965 | Martin | 174—15 |
| 3,280,389 | 10/1966 | Martin | 317—234 |
| 3,301,315 | 1/1967 | Webb | 165—80 X |

FOREIGN PATENTS

| | | |
|---|---|---|
| 1,184,000 | 5/1962 | Germany. |

ROBERT A. O'LEARY, *Primary Examiner.*

A. W. DAVIS, *Assistant Examiner.*